(12) United States Patent
Bluck et al.

(10) Patent No.: US 7,611,322 B2
(45) Date of Patent: Nov. 3, 2009

(54) PROCESSING THIN WAFERS

(75) Inventors: Terry Bluck, Santa Clara County, CA (US); Stuart Scollay, Santa Clara County, CA (US); Edric Tong, Santa Clara County, CA (US)

(73) Assignee: Intevac, Inc., Santa Clara, CA (US)

( * ) Notice: Subject to any disclaimer, the term of this patent is extended or adjusted under 35 U.S.C. 154(b) by 643 days.

(21) Appl. No.: 11/218,085

(22) Filed: Aug. 31, 2005

(65) Prior Publication Data

US 2006/0102285 A1 May 18, 2006

Related U.S. Application Data

(63) Continuation-in-part of application No. 10/991,722, filed on Nov. 18, 2004.

(51) Int. Cl.
*B65H 1/00* (2006.01)
*H01L 21/677* (2006.01)
*C23F 1/00* (2006.01)
*C23C 16/00* (2006.01)
*H01L 21/00* (2006.01)

(52) U.S. Cl. .................. 414/805; 414/217; 414/935; 414/936; 414/939; 414/941; 156/345.31; 156/345.32; 118/719; 118/733

(58) Field of Classification Search ........ 414/217–226.5, 414/589, 781, 805–806, 935–941; 156/345.31–345.32; 118/719, 733
See application file for complete search history.

(56) References Cited

U.S. PATENT DOCUMENTS

| 5,174,881 | A  | * | 12/1992 | Iwasaki et al. | ......... 204/298.25 |
| 6,238,160 | B1 | * | 5/2001  | Hwang et al.   | ............... 414/217 |
| 6,251,191 | B1 | * | 6/2001  | Matsuse        | ..................... 118/719 |
| 6,667,250 | B2 | * | 12/2003 | Sasaoka et al. | ............. 438/795 |
| 2004/0187791 | A1 |  | 9/2004 | Buse et al.    | |

* cited by examiner

*Primary Examiner*—Karla Moore
(74) *Attorney, Agent, or Firm*—Nixon Peabody LLP; Joseph Bach, Esq.

(57) ABSTRACT

There is described a wafer processing system for thinned wafers that are easily broken during handling. The system protects against breakage during handling and provides for temperature controls during processing.

8 Claims, 6 Drawing Sheets

PROCESSING THIN WAFERS

This application is a continuation in part of now pending Ser. No. 10/991,722, filed Nov. 18, 2004 and entitled Wafer Fab.

BACKGROUND OF THE INVENTION

This invention relates generally to method and apparatus for the processing, manufacture and handling of thin wafers, and more particularly, the preparation of very thin semiconductor wafers to enable manufacture of very thin semiconductor devices.

Modern electronic equipment and particularly consumer portable electronic equipment relies heavily on using semiconductor devices. Much of this equipment is small and the trend is to make it smaller still. To achieve smallness in consumer products and an ability to perform various functions, these units or systems (consumer products) require thin semiconductor devices for operations. For example modern cell phones which in the last decade have become essential for substantially the entire public, are being put to many new and challenging applications and to perform these applications, these phones require a number of semiconductor devices to be housed within small compartments. In particular, cell phones are today being asked to browse the web, to upload videos, to download music and ring tones, provide information based on satellite navigation systems, to act as hand calculators and/or reminder calendar and/or memory of various other information, to send and receive messages and to take and send photos among other things. Thus these units require semiconductor devices beyond those useful only for telephone purposes. At the same time the public requires that the phones themselves be made smaller and lighter. The demands on such consumer units can only be achieved with the limited space available for these various functional devices if one fits more semiconductor devices into the small space available or into a smaller space than that available today as to create an even smaller and lighter consumer product. Otherwise the handset for example of a telephone must get bigger and bigger and heavier and heavier. This is not acceptable to the general public. These same comments fit modern laptop computers as well as other consumer products such as music recorders. We no longer want laptops for example that weigh 6 to 8 pounds. Instead we ask that the new units weigh half of that amount and have more capabilities than their predecessor units. This can only be achieved with lighter and more efficient semiconductor devices.

A solution to this challenge is to add more circuitry on the semiconductor. This of course is being attempted at all times. Another, which obviously is to be combined with the increases of circuits is to work with thinner wafers that in turn are used to make thinner semiconductor devices. For example, a typical wafer today has a thickness of about 750 microns and devices made from such wafers have a similar thickness. If one can reduce the thickness of the semiconductor device to about 50 microns, this would enable one to fit a number of such devices, for example, one on top of another, in the space that previously had been occupied by a single such device. A further benefit to having thinner devices is that during operation as part of a consumer product, semiconductor devices heat. The thicker the device the slower the dissipation of the heat. Thus the creation of thinner semiconductor devices has the further benefit of creating units that because of their ability to cool more rapidly operate more effectively for their intended purpose. Obviously, if the thickness is reduced, there is also a desired reduction in weight of the consumer products that use these semiconductor devices.

A problem that arises however is how to manufacture extremely thin semiconductor devices without destroying the wafers out of which they are made. Modern wafer making equipment can deal with wafers that are 750 microns thick. The equipment was designed for such wafers. Various manufacturers also include wafer-handling systems in processing units they manufacture and such units also can handle wafers that are 750 microns thick. However, when a wafer is reduced to approximately 50 microns in thickness, approximately $1/15^{th}$ the thickness of wafers being handled in present day wafer handling equipment, the wafers become extremely brittle. If in addition the diameters of wafers used in manufacturing are either at the largest size since this brings about efficiencies in manufacturing or as typically is the case, about 300 mm in diameter, handling such wafers with existing equipment generally results in damage to wafers which will readily snap or break as moved from support system to support system and are then either useless or too expensive for making operable semiconductor devices.

SUMMARY OF THE INVENTION

There is described novel handling systems and methods to process thin wafers in wafer fab equipment. There is also described treatment processes to manufacture thin wafers for thin and light semiconductor devices. Thus this invention enables the processing and manufacture of thin wafers that can then be used in the manufacture of very thin semiconductor devices.

One of the process steps in the manufacture of thin wafers is to assure that the backside of the wafer is uniform and is uniformly treated. This is accomplished in accordance with this invention by manipulating the wafers so that the rear surface of the wafer is processed in the processing units. Thus after the initial thinning of wafers, which may be done for example mechanically, wafers are introduced into equipment as described herein in position so that the rear surface of the wafer is the surface that is processed. Thus, and for example, the rear surface may be exposed to an etch step to clean the surface or to assure uniformity in the wafer thickness. Other processes that typically will be performed on this rear surface include metallization or other deposition process. Depending on the practices of the wafer manufacturer, wafers may be taped at their front surfaces before they are processed. Taping has the benefit of assuring better protection for the front surface on which the circuits will be placed or are in place and also prevents breaking.

It is accordingly an object of this invention to describe wafer handling equipment that will transfer, handle and process very thin wafers with a minimum of breakage as to permit wafer preparation for the manufacture of thin semiconductor devices. A particular application of this invention is in the manufacture of thin semiconductor wafers in automated wafer handling and processing equipment, as described in the aforementioned parent application, applied to the manufacture of very thin semiconductor devices. It has also been found that in processing thin wafers, particularly those that include tape on the circuit side, that they heat readily and quickly and if heat is not dissipated rapidly during the manufacturing processes one cannot achieve processed wafers useful for semiconductor devices. In essence processes such as etching or sputtering tend also to increase temperatures and if temperatures of wafers during processing are not adequately controlled, the processes themselves do not conform to set specifications. Thus, and in accordance with this invention there is described wafer handling equipment that can move and process wafers as thin as about 50 microns as compared to prior art processing equipment that processes wafers of about 750 microns in thickness. Also in achieving this objective wafers are kept cooled during the manufacturing processes to facilitate normal performance during processing steps including etching, sputtering and plasma enhanced deposition, among others. Thus cooling is practiced during processing so that the wafer is at a controlled temperature at the time it moves out of a processing station and is cooled as it is processed in a next station. Using thin wafers that have been manufactured in this fashion it becomes feasible to manufacture semiconductor devices that will permit, among other things, stacking one on top of the other as to enable multiple and related or unrelated functions being built into modern day equipment by, for example, by including a number of control circuits in a limited space where only one or two such functional devices could previously be housed while at the same time creating smaller and lighter equipment with greater functionality. A further benefit of this invention is that the circuitry made with the thin wafers made in accordance with this invention operate at cooler temperatures since heat is more readily dissipated when the wafer is thin with the effect that the devices employing such manufactured devices will operate more closely to their design criteria, will require less cooling and will be less disruptive of the functioning of other controls within the systems.

BRIEF DESCRIPTION OF THE DRAWINGS

These features and advantages of the present invention will be more fully understood by reference to the following detailed description in conjunction with the attached drawings.

FIG. 1 shows a schematic view of a four station wafer fab system. Although systems, for example of 20 or more stations, may be assembled and discussed, this Figure is useful in providing an overview of the operation of a four station system and at the same time explains how a much larger or even smaller system will operate. Importantly, this system illustrates substantially the key components including transport paths of larger systems as to enable an understanding of system operations and it does so with less complications than would be present if one were to discuss a larger unit. (The parent application of this invention includes such a larger processing system and the disclosure of the parent is incorporated herein by reference.)

In FIG. 1, the front end of the system is identified as 12. 20 represents an etch process chamber and 21 a sputter clean process chamber. 22 represents physical vapor deposition chambers and 23 illustrate gas ports. The gas ports may be connected to gas boxes 25. Two are illustrated on the showing surface and these are backed by ones on the other side. Gas ports 23 may comprise for example input and output ports for the feeding of gases from or to gas boxes 25 for use in one or more chambers. 13 represents a load lock and 15 a shuttle or transverse chamber. Both the load lock 13 and the shuttle chamber 15 include two compartments. In the case of the load lock a chamber adjacent to the front processing chamber 22 acts as a pre-load lock chamber where a wafer is placed after processing, for example, after treatment within chamber 22 but prior to being loaded into the final stage of the load lock at which point the wafer is returned to atmospheric conditions and then exits from the system. In the case of the shuttle chamber, a wafer is placed into a chamber adjacent to the second physical vapor deposition chamber 21 and is then transferred to the adjacent row of chambers where it is moved in the opposite direction through processing chambers 22 and then into the preload lock chamber to await transfer to the final load lock station 13 following which the wafer exits the system. 27 represent a vacuum pump. This pump is used, among other things, to draw a vacuum in load lock chamber 13. Other uses may comprise pump down of processing chambers or alternatively separate pumps may be used with each of the processing chambers. In general it is necessary to maintain high vacuum conditions in each of the processing chambers to carry out semiconductor process steps. Processor power supplies 16 are positioned at the rear of the system below transfer shuttle 15 and computer processors are housed in a compartment shown at 24.

In FIG. 2 there is illustrated a mechanism including wafer handling in connection the movement of wafers into load lock 13 and from load lock 13 into processing chambers 18. In this Figure there is illustrated wafers 43 positioned in or on wafer cassette carrier 29 from which a wafer 43 on wafer carrier arm 9 of robot 11 is transported from cassette carrier 29 into load lock 13. For illustrative purposes, two processor sections 18 are illustrated in this Figure following load lock 13. In a typical system there would follow other processing chambers, such as 18, and/or a shuttle chamber, following the second chamber shown on the right side of this Figure as, for example, is illustrated in FIG. 1. As shown, a wafer 43 is being moved toward the entrance of load lock 13 where it will be positioned on a chuck for transfer through the system as will be more fully described in connection with FIG. 3. Wafers 43 are illustrated in different positions in processing chambers 18 of this FIG. 2. A wafer 43 loaded into load lock 13 is being fed, again as will be described more fully in connection with FIG. 3, into carrier 40 and moves on carrier 40 into and through process chambers 18. Carriers transfer wafers throughout the system and ultimately back into load lock 13 from which wafers leave the system. The processes associated with load lock 13 will be discussed more fully in describing FIG. 3. Key is that the wafer entering the load lock is carried from atmosphere into a vacuum and leaves the load lock 13 on an electrostatic chuck 60 positioned on a carrier 40. The carrier 40 travels with wafer 43 as it transfers wafer 43 into adjacent processing stations 18. There the wafer is processed. Thereafter the carrier will transport the wafer back into the load lock 13 where wafer 43 will exit the system. In FIG. 2, in the first processing compartment 18 (the middle compartment in this Figure) there is illustrated a wafer 43 elevated by pedestal 57. The pedestal 57 has raised wafer 43 by passing through an opening in carrier 40 elevating wafer 43 for treatment within the upper processing chamber. When processing is completed, wafer 43 is lowered again still on chuck 60 back into carrier 40 where it remains as it transfers out of the chamber and into the next chamber for further processing. Once wafer 43 is attached to chuck 60, it remains attached through all process steps until separated from the chuck at the load lock station as the wafer is prepared to leave the system. This too will be described in connection with FIG. 3. In turn a wafer 43 on chuck 60 moves through the system on a carrier 40. Pedestals 57 located beneath the carriers and chucks in process chambers are, for example, housed within bellows 58 to maintain vacuum conditions and to enable, when desired, elevation to position the wafer into the upper process chamber for processing therein. When processing is completed, pedestal 57 lowers wafer 43 into carrier 40 and carrier 40 then transfers the wafer to the next chamber. In the next chamber, depending on the processes within that chamber, another pedestal may raise the wafer, again while on the electrostatic chuck, to the upper processing chamber for wafer processing. Chambers do exist for processes that do not require elevation of the wafer to an upper chamber for processing. In a sense such a chamber might be illustrated in the chamber on the far right where the wafer has not been elevated to the upper area. In essence this system is intended to operate with the various processes that may be selected by the ultimate system user and it is not intended by the description herein to limit processing to any particular chamber or particular process. Transfer chamber 15 illustrated at the end of the processing chambers of the system (see FIG. 1) illustrates transport of the wafer on a chuck into another line of processing chambers before the wafer exits the system. Such a transfer station would be located at the end of a line of processing stations, as is illustrated in FIG. 1 and as is shown in greater detail in the parent application of this application.

Reference is now had to FIG. 3, which shows in step segments (A-F) the motion sequence of placing a wafer onto a chuck at the load lock station and in turn the chuck into the carrier, again at the load lock station, for transfer of the wafer into the processing stations of the system for processing therein. As illustrated in FIG. 2 a robot 11 carries a new wafer into load lock 13 employing wafer carrier arm 9. (The wafer 43 actually appears in load lock 13 in FIG. 3B.) In FIGS. 3A through 3F, the load lock 13 is illustrated and there is described the movement of wafer 43 as it proceeds through the load lock and into the processing stations.

Figure 1:
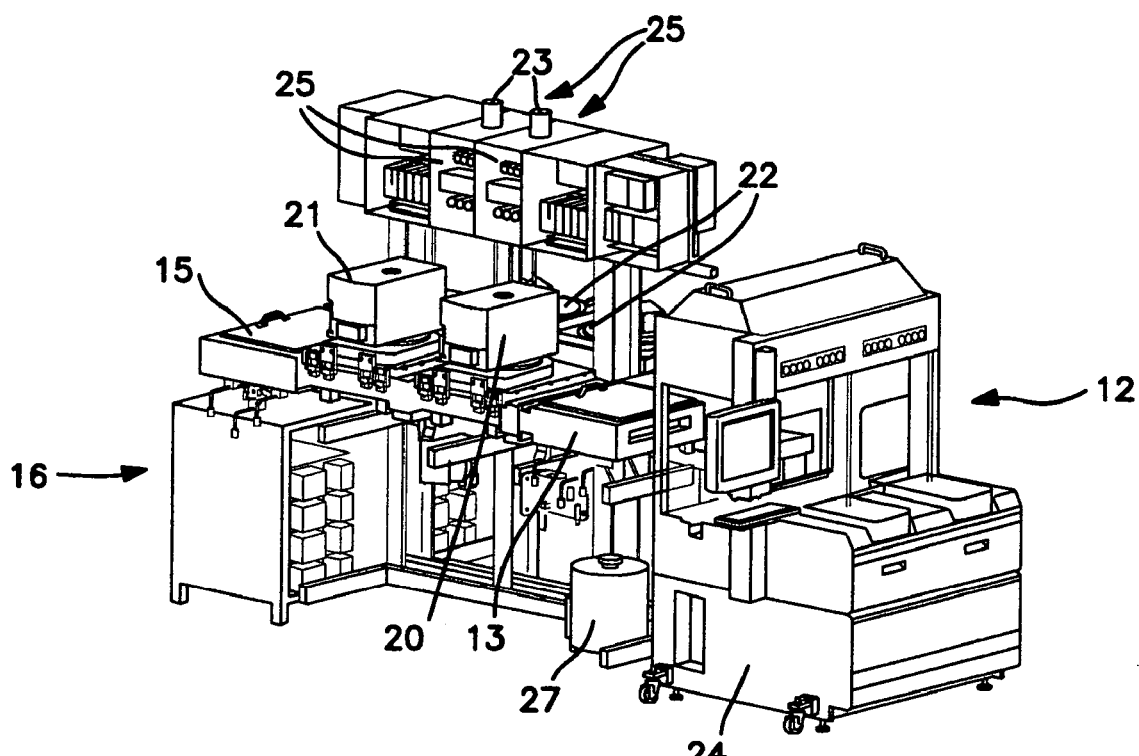
FIG. 1 is a schematic illustration of a four station wafer processing system.

Within load lock 13 is positioned a non-contact wafer chuck 30. This is a different chuck than the electrostatic chuck that has been mentioned previously. This chuck is shown as item 30 in FIGS. 3A-3F. This chuck acts as a vacuum preloaded air bearing. It is porous in nature and permits a gas and vacuum flow in a generally uniform manner though its volume. It has a cushion platform. This enables drawing or attracting a wafer from the support of the robot arm 9 that carries wafer 43 into the load lock upward to the chuck where it is held close to, but not in contact, with non-contact chuck 30. An example of a chuck that may be employed is manufactured by CoreFlow Scientific Solutions Ltd. of Yoqneam, Israel, with offices at Los Gatos, Calif. and is sold as a Non-Contact wafer chuck. There are other chuck designs that may be used. For example a chuck using the Bernoulli effect will operate for this purpose just as well.

Figure 3A:
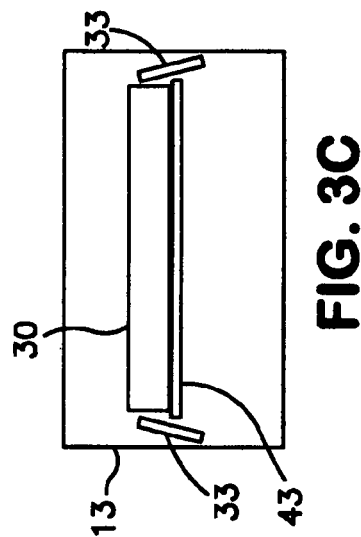
FIGS. 3A through 3F illustrate an animated showing of the feed of a wafer into the load lock station and its preparation to transfer from the load lock into processing stations of the processing system.
Figure 3B:
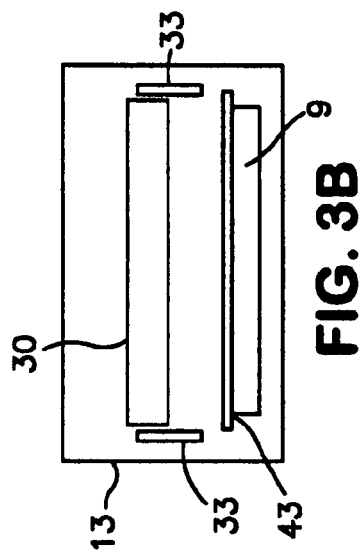
Figure 3C:
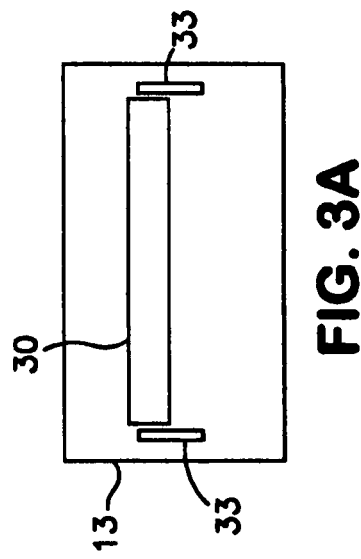

In FIG. 3B there is illustrated bringing a wafer 43 into load lock 13 and in FIG. 3C there is illustrated moving the wafer to the surface of the non-contact chuck 30. The vacuum draws the wafer toward the surface of the chuck while a counterflow of a gas occurs through the volume of chuck 30 as to create a gas cushion along the face of the chuck spacing wafer 43 from the surface of chuck 30 thereby preserving the surface of the wafer free of any touching materials or surfaces. In this way wafer 43 is handled in a most delicate fashion. In essence the vacuum lifts the wafer without making touching contact to the wafer and the gas holds the wafer in position while avoiding contact with the surface of the chuck. Also illustrated in FIGS. 3A-3F are positioning or centering arms 33. The purpose of arms 33 is to permit the wafer to move from its entry position to a position adjacent the surface of the non-contact chuck and eventually as shown in later figures of this sequence to the surface of an electrostatic chuck while being maintained in a central position, first in connection with the non-contact chuck and eventually with the electrostatic chuck. These positioning arms are helpful where the wafer is generally floating or cushioned above or below surfaces to prevent skating of the wafer away from a central position of the underlying associated support element.

The vacuum gas pressure through non contact chuck 30 should be enough to overcome gravity taking into consideration the mass of the wafer. As should be appreciated the wafer will vary depending on its thickness and depending further on whether it is taped on one side and if so the weight of the tape. In general the vacuum gas pressure should also be balanced so that it does not overcome the cushion of gas at the surface of chuck 30 that maintains the wafer out of contact with chuck 30.

Figure 3D:
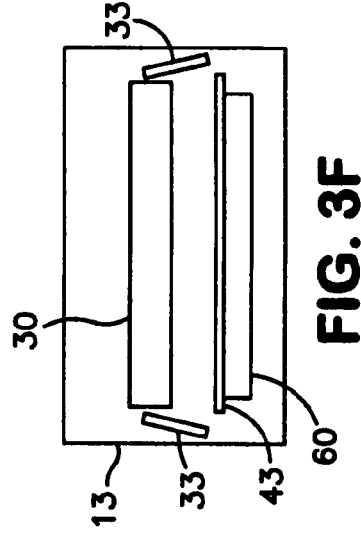

In FIG. 3B wafer 43 is shown as having entered load lock 13. Wafer 43 enters at a position below and generally parallel to non-contact wafer chuck 30 on arm 9. At this point there has been no change in arm 33. A flow of gas through non-contact wafer 30 is initiated and as shown in FIG. 3C control of the wafer is taken over by the non-contact chuck 30 as the wafer is raised to non-contact chuck 30. At this point arm 9 is removed from load lock 13 since it has no further function in connection with the transfer of the wafer in the system. Also as shown in FIG. 3C, arm 33 is moved away from non-contact chuck 30 so as not to be in the way when wafer 43 moves into a close position to non-contact chuck 30. Arm 33, as shown in FIG. 3D, is moved back to its original position to assure that the wafer is centered adjacent to non-contact chuck 30. Although only two arms 30 are illustrated in this FIG. 3, in fact at least three such arms would be used to assure proper positioning of the wafer in a generally central area of the chuck. Arms 33 are moved into and out of position along the edge of chuck 30 by electromagnets positioned in the wall of load lock 13. In FIG. 3D while arms 33 assure positioning and centering of wafer 43 on non-contact chuck 34, an electrostatic chuck 60 is brought up to wafer 43 from below.

Figure 2:
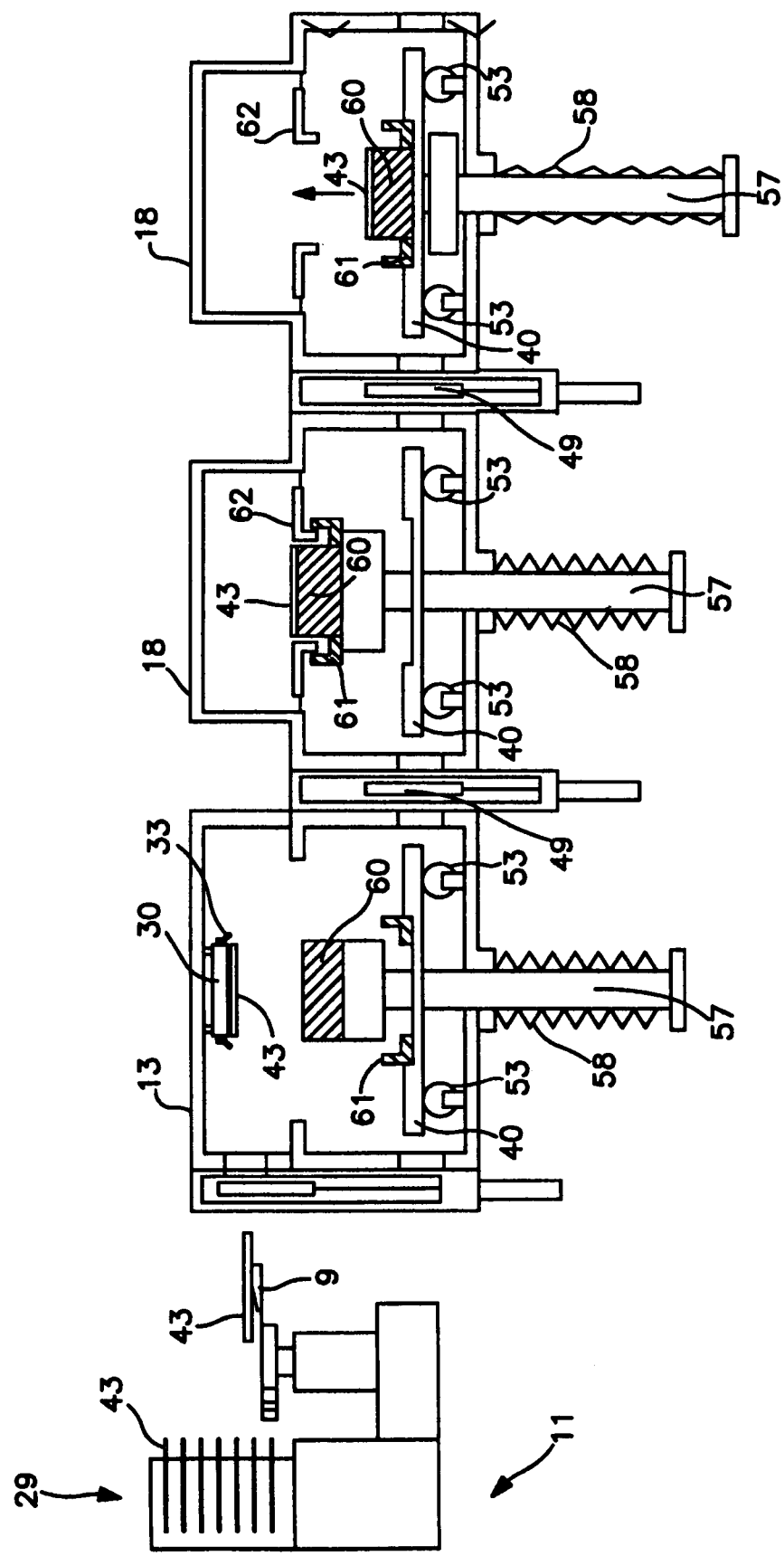
FIG. 2 is a schematic illustration of a portion of the wafer processing system starting with a robotic feed followed by two stations in the processing equipment.
Figure 3E:
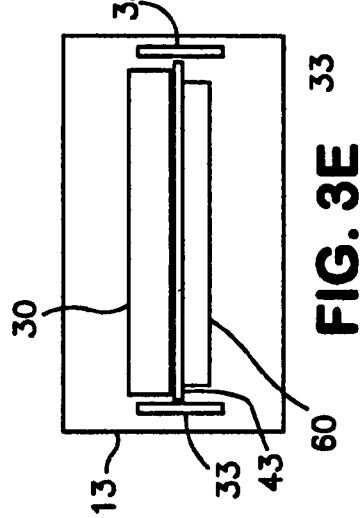
Figure 3F:
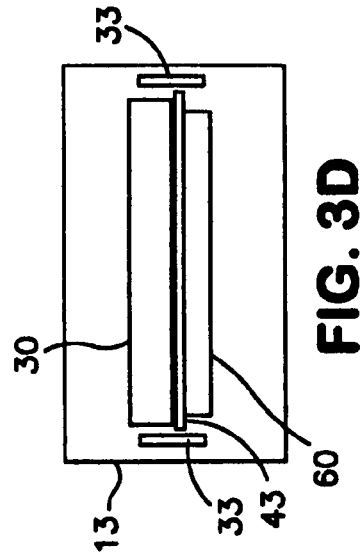

The electrostatic chuck is mounted on a pedestal as will be discussed in connection with figures that follow. In this FIG. 3 the pedestal has been omitted to avoid confusion. (FIG. 2 however shows the positioning of the electrostatic chuck on its pedestal.) The electrostatic chuck (e-chuck) is brought to wafer 43 in FIG. 3D. It too is constructed as to permit gas and vacuum to feed through its volume and this is done while the vacuum is reduced in non-contact chuck 30 as to float wafer 43 onto the surface of e-chuck 60 while wafer 43 is maintained in a centered position by arms 33. Arms 33 also prevent skating of wafer 43 over the surface of e-chuck 60. Also the cushions of air at the surfaces of the chucks 30 and 60 prevent damage to wafer 43 during transfer. When wafer 43 has moved to the control of e-chuck 60 as illustrated in FIG. 3E, the gas flow and vacuum draw on non-contact chuck 30 and on e-chuck 60 is stopped. Wafer 43 is then withdrawn away from non-contact chuck as shown in FIG. 3F, load lock 13 is sealed and pumped to vacuum conditions thus matching the environment of the processing chambers which are to follow. In FIG. 3F once vacuum conditions are achieved, a plasma is struck causing wafer 43 to be electrostatically bound to e-chuck 60 and e-chuck 60 holding wafer 43 on its surface is then placed into a carrier (again not shown in this Figure but illustrated as below the pedestal and e-chuck in the load lock compartment 13 in FIG. 2) for movement of the wafer out of load lock 13 and into and through the processing chambers.

During this transfer process, gas is introduced through the pedestal supporting e-chuck 60. The e-chuck includes a pattern of small holes to permit the compressed gas to pass through so that the wafer will initially float on this gas when it is released to the e-chuck from the non-contact chuck. Thus the wafer is carried by gas cushions when it is in position adjacent to the non-contact chuck and when it is being transferred to the e-chuck. The gas cushions in each instance provide for a soft transfer and a soft landing when the wafer moves between surfaces.

The use of gas cushions both in moving the wafer from surface to surface and between surfaces achieves a key objective of this invention of enabling processing of very thin wafers without damage to the wafers while moving from surface to surface and from chamber to chamber. Once the e-chuck is in control of the wafer, the wafer is electrostatically tied to the e-chuck and is moved into a carrier and with the carrier into and through the processing stations. Since the wafer is electrostatically bound at this point to the e-chuck and moves with an associated carrier it proceeds through the various processing stations without damage to the thin wafer. In essence once the wafer becomes bound to the e-chuck, handling of the wafer is completed until the wafer is returned to the load lock and removed from the load lock back into a holding cassette. The process of transferring the wafer out of the load lock is a reverse procedure of the process of transferring the wafer into the treating chambers. Thus the wafer is brought into the load lock on the e-chuck while the load lock is under vacuum conditions, where the environment is changed and the wafer is transferred to a non-contact chuck and then to the robotic arm that removes the wafer from the load lock chamber and places it back into a cassette where processed wafers are collected. When the wafer enters the load lock after being processed, the load lock chamber is at vacuum. In essence the transfer of the wafer out of the system at the load lock is also achieved while the wafer is cushioned by gas and makes soft transfers between surfaces from the e-chuck to the non contact chuck to the robotic arm 9 and then out of the system and back into a cassette which is at normal environmental conditions. The sequence of steps followed may be traced from FIG. 3F back through the other Figures in FIG. 3 until it reaches arm 9 in FIG. 3B where it is removed from load lock 13 and load lock 13 is conditioned to accept a new wafer for processing.

As has been mentioned, the described system operates with the wafer taped or untaped. Taping is by choice used or not by the wafer processor. Some manufacturers prefer to tape the active or circuit side of the wafer while others prefer not to do so. In the event that taping is used it has generally been found that breakage is reduced since the tape actually adds strength to the thin wafer. Also tape can protect the taped side of the wafer. Taping, however, does lower the thermal conductivity of the wafer as it proceeds through processing steps as to add to the temperature wafers achieve and to require that provisions be made to adequately dissipate the heat to facilitate processing steps under controlled conditions. Tapes up to about 12 mils in thickness may be used in the system described and various tape materials are used in this industry for this purpose.

Figure 4:
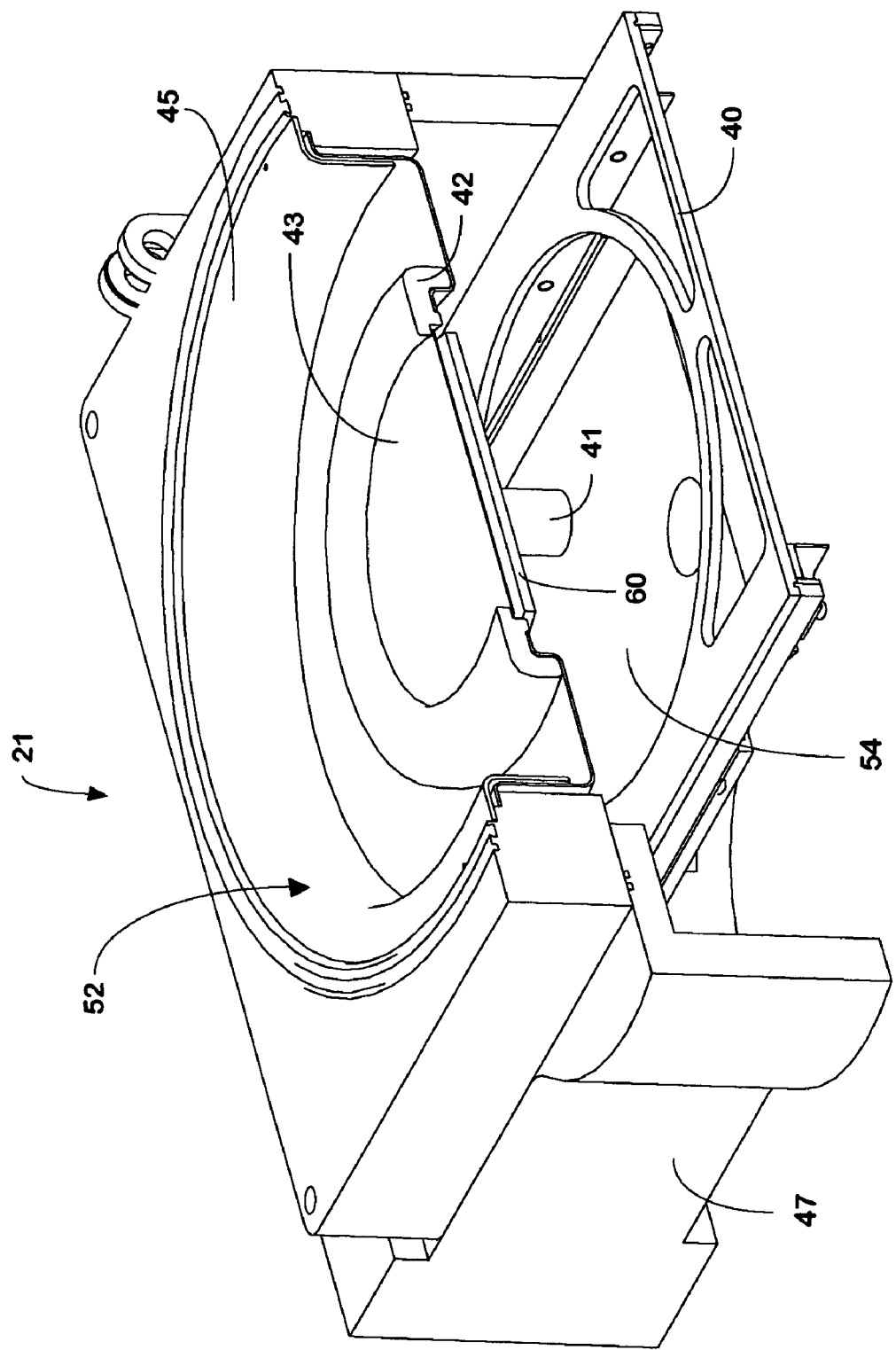
FIG. 4 is a schematic illustration of a cutaway view of a processing chamber according to this invention.

Reference is now had to FIG. 4 that is a partial cutaway view of a processing chamber 21, such as a sputter chamber. This chamber and its operation is included in this disclosure as an example of the operation of one type of processing chamber in connection with this invention. A more detailed description of such chambers and the paths of the carriers through the system is found in the aforementioned parent application. Further skilled workers in this field will readily appreciate how processing chambers can be positioned and structured to operate on wafers travelling through the system for processing. A wafer 43, electrostatically mounted to an e-chuck, is placed into carrier 40 at the load lock station and travels through the system in the carrier until it returns to the load lock for unloading of the wafer from the system. As illustrated the wafer on an e-chuck is supported by carrier 40 during transport. In a station such as the one illustrated in FIG. 4, pedestal 41 raises wafer 43 (on e-chuck 60) out of carrier 40 and brings the wafer into near contact with isolation ring 42. Shields 45, cover the side walls of the chamber and in the case of a sputtering process chamber can periodically be replaced in order to avoid contamination of newly sputtered wafers from old deposited materials. In the case of a sputter chamber, a sputter source is placed across the upper walls of the chamber as to seal the upper wall of the chamber. This also facilitates the changing of sputter targets by removing this upper seal, replacing the target and then resealing the chamber with a new target within.

Figure 5:
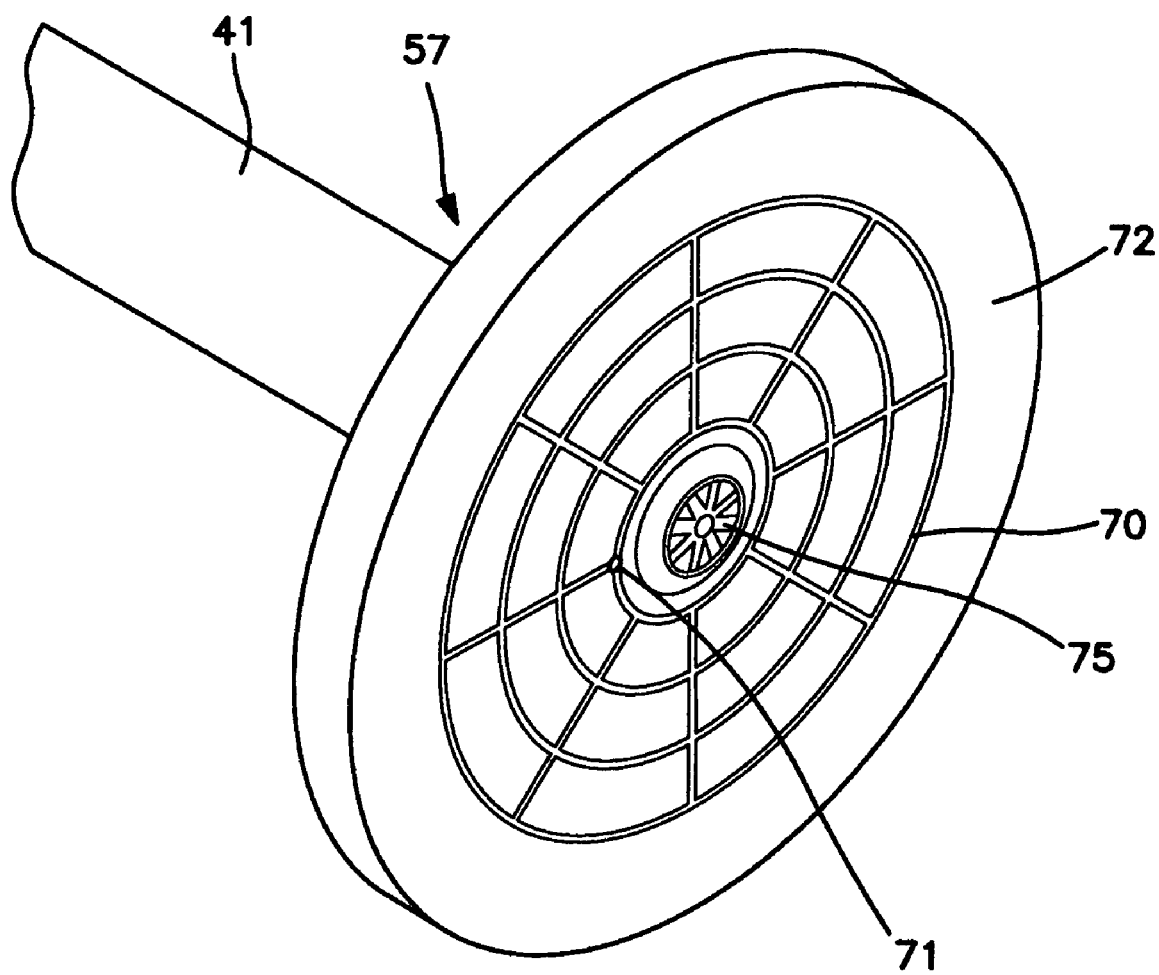
FIG. 5 is a schematic illustration of the pedestal used to carry the e-chuck to the various stations of the system.

Referring now to FIG. 5, there is illustrated streets 70 around and across the upper surface 72 of pedestal 57. Streets 70 are connected to gas outlet 71. This enables the feeding of a control gas such as helium into the interface area between the pedestal's upper surface 72 and an e-chuck when an e-chuck is in position on this pedestal upper surface 72. Gas is fed from a pressure controller through piping which extends through the central area of extension arm 41 of pedestal 57 to gas outlet 71. The piping also includes a ceramic portion to provide electrical insulation between the piping and the pedestal support surface 76. In the central area of the pedestal upper surface 72 there is illustrated an electrical contact 75 for the e-chuck when in position on upper surface 72. The contact 75 is a spring like element that presses against the e-chuck to bring about chucking and the application of an RF bias. As is the case of the gas feed, the electrical feed is also through extension arm 41.

Figure 6:
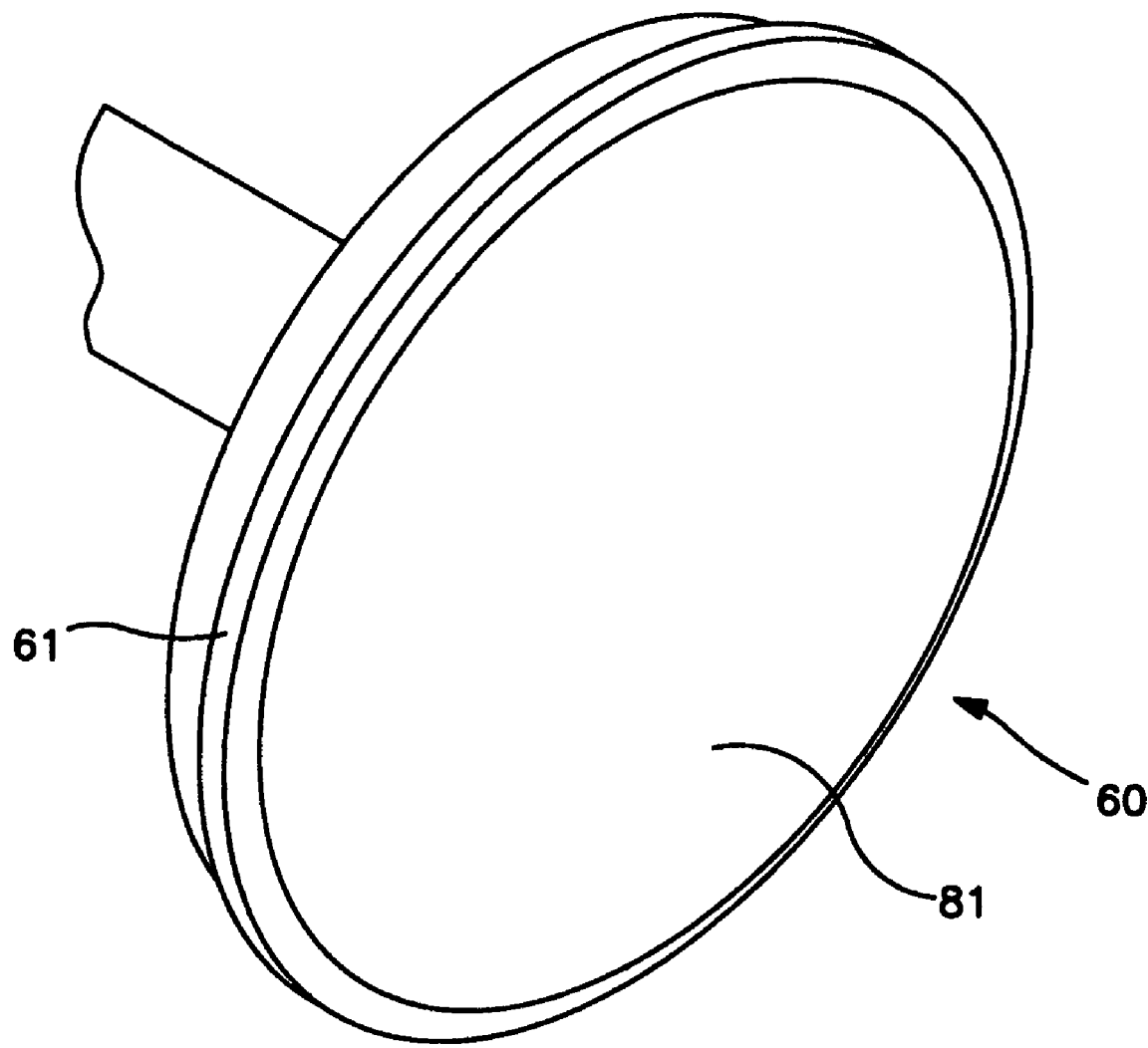
FIG. 6 is a schematic illustration of an e-chuck in position on a pedestal in accordance with this invention.

The chuck 60, as shown in FIG. 6, comprises a porous aluminum body with an anodized exterior surface 81. The material shown is anodized aluminum but may also comprise any porous material with appropriate electrical characteristics enabling electrostatic binding of the chuck in place against the pedestal while the wafer is bound to the chuck. The upper surface of pedestal 72 is also a ∈ surface as is the facing surface of the chuck. A standoff voltage of about 2 KV is used between the wafer and chuck and the chuck and pedestal to keep the surfaces together. The gas that reaches the pedestal upper surface 72 also travels into the porous areas or holes in the chuck and up to the wafer chuck interface. This follows since the gas entering streets 70 from outlet 71 is under pressure and is being fed to an area under vacuum conditions. It accordingly migrates to any area open to it and the openings in the chuck provide an attractive and welcome path. The gas in essence on coming to this vacuum enclosed area simply fills the voids. An effort is made to keep all gases in this area from leaking into the chamber. Around the edge of the chuck is seal 61 which has been previously discussed in connection with FIG. 2. The gas, in a cooling operation of the wafer, transports heat from the wafer into the pedestal as the heated gas, is moved away from the wafer. The pedestal in turn is cooled by water and water transports the heat out of the pedestal.

This system achieves advantages in cooling in using a thick thermal mass e-chuck. In vacuum systems it can be difficult to cool substrates and when one uses a movable chuck it is even harder to cool the chuck and the substrates. Through the use of a large thermal mass the wafer can be kept cool and the total cooling process can also be spread over several chambers if required.

The unique aspect of the present invention is the handling of the wafer so that at no time is the wafer itself exposed to pressures or movements that might create stresses to cause the wafer to snap or break. Key of course is getting the wafer onto the e-chuck from the cassette and getting the wafer back into a cassette after processing. A preferred way to achieve the desired results has been shown and discussed. Also discussed has been the fact that while the wafer is associated with the e-chuck and is moving through the system in a carrier, the wafer may be subjected to any number of different processes, known to those skilled in the art, which may be positioned along the path of travel of the carrier in which the e-chuck carrying a wafer resides.

While this invention has been discussed in terms of exemplary embodiments of specific materials, and specific steps it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. The method of transferring a silicon wafer with a thinned back surface from a robotic arm into processing stations comprising moving said thinned back surface wafer on the robotic arm into a load lock chamber, elevating said wafer from said arm to a non-contact chuck within said load lock chamber using negative and positive pressure gas applied through said non-contact chuck, said wafer being raised close to but maintained out of contact with said non-contact chuck, removing said robotic arm from said load lock chamber, lowering said wafer to an electrostatic chuck positioned in said load lock chamber below said non-contact chuck using gas flow through said non-contact chuck and through said electrostatic chuck to bring said wafer close to but not into contact with said electrostatic chuck, sealing and drawing a vacuum in said load lock chamber, striking a plasma in said load lock chamber as to bind said wafer to said electrostatic chuck, and then under vacuum conditions moving said electrostatic chuck carrying said wafer out of said load lock chamber for processing of said wafer in follow-on semiconductor processing chambers.

2. The method of claim 1 including preventing said wafer from skating along a surface of said non-contact chuck when said wafer is close to but out of contact with said non-contact chuck by positioning arms along the circumference of said non-contact chuck to maintain said wafer centrally positioned over said non-contact chuck.

3. The method of claim 2 including placing said electrostatic chuck into a carrier in said load lock prior to the application of a plasma to bind said wafer to said electrostatic chuck.

4. The method of claim 3 including moving said wafer in said carrier from said load lock into said follow-on semiconductor processing chambers.

5. The method of claim 3 including cooling said wafer while in said load lock chamber by applying a cooling gas to said wafer while in position along a face of said electrostatic chuck.

6. The method of claim 5 including performing said cooling after said wafer is bound to said electrostatic chuck.

7. The method of claim 6 including cooling said wafer during processing in said follow-on processing chambers during semiconductor processing of said wafer.

8. The method of claim 1 including moving said wafer into said load lock on said electrostatic chuck following processing of said wafer in said follow-on processing chambers and moving said wafer from said electrostatic chuck by transferring to an area of said non-contact chuck without contacting the facing surface of said wafer with said non-contact chuck and then moving said wafer out of said load lock and into atmosphere.

* * * * *